(12) United States Patent
Crowell

(10) Patent No.: US 7,071,704 B1
(45) Date of Patent: Jul. 4, 2006

(54) CIRCUIT FOR IMPROVED DIAGNOSABILITY OF DEFECTS IN A FUSE SCAN STRUCTURE

(75) Inventor: Gregory Crowell, Longmont, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 11/125,860

(22) Filed: May 10, 2005

(51) Int. Cl.
*G01R 31/02* (2006.01)
(52) U.S. Cl. .................. 324/550; 324/537; 714/718
(58) Field of Classification Search ................ 324/550
See application file for complete search history.

(56) References Cited

U.S. PATENT DOCUMENTS 6,886,117 B1 * 4/2005 Ku ........................... 714/711
2003/0226078 A1 * 12/2003 Meaney et al. ............. 714/726

OTHER PUBLICATIONS

Rabaey et al., Digital Integrated Circuits, 2003, Prentice Hall, Second Edition, pp. 358-361.*

* cited by examiner

*Primary Examiner*—Anjan Deb
*Assistant Examiner*—John Zhu
(74) *Attorney, Agent, or Firm*—Christopher P. Maiorana, P.C.

(57) ABSTRACT

An apparatus comprising a first control circuit, a second control circuit, a latch circuit and a flip-flop. The first control circuit may be configured to generate a first control signal in response to (i) an input signal from a fuse and (ii) one or more read signals. The latch circuit may be configured to change status in response to the first control signal. The second control circuit may be configured to change the state of the latch circuit in response to (i) one or more read signals and (ii) one or more set signals. The flip-flop may be configured to capture the state of the fuse in response to changing the state of the latch circuit with the first control circuit or the second control circuit.

18 Claims, 5 Drawing Sheets

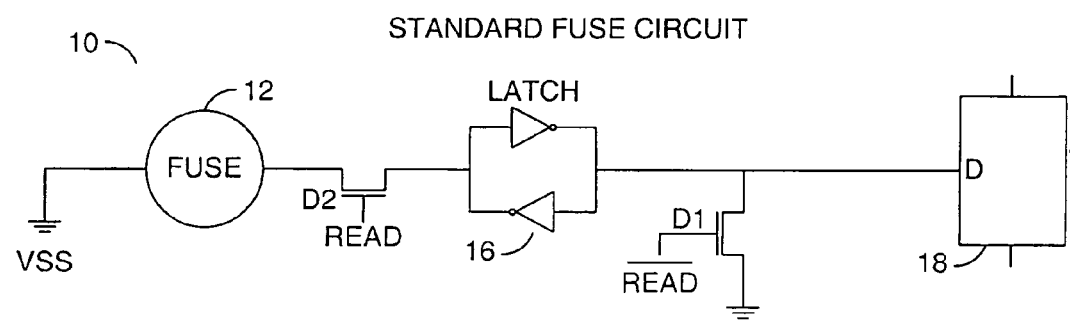
(CONVENTIONAL)
FIG. 1

CIRCUIT FOR IMPROVED DIAGNOSABILITY OF DEFECTS IN A FUSE SCAN STRUCTURE

FIELD OF THE INVENTION

The present invention relates to fuse structures generally and, more particularly, to an apparatus and/or method for improving diagnosability of defects in a fuse scan structure.

BACKGROUND OF THE INVENTION

Conventional fuse structures that can be modified with a laser are common components in Built In Self Repair (BISR) circuits used in memory devices. Referring to FIG. 1, an example of a circuit 10 illustrating a conventional fuse structure is shown. The circuit 10 includes a fuse 12, a latch circuit 16, a transistor D1, a transistor D2 and a scannable flip-flop 18. Normally the latch circuit 16 is held to a known state by the transistor D1. The transistor D2 is used to pass the state of the fuse 12 to the latch circuit 16. If the fuse 12 is intact, the input to the latch 16 is effectively tied to VSS, resulting in a high state on the output of the latch 16. If the fuse 12 is blown, the input to the latch 16 will be floating, resulting in a continued low output from the latch. The state of the fuse 12 is captured by the scannable flip-flop 18. The flip-flop 18 is connected to other fuse structures (not shown) in a fuse scan chain. The state of the fuse 12 is often difficult to diagnose, particularly after the fuse 12 has blown prior to final testing.

The inability to diagnose fuses in independent fuse structures may be partially overcome if none of the fuses have blown. The latch circuit 16 is normally in a low state because of the pull-down transistor D2. By scanning the initial state of the fuse 12 with the flip-flop 18, and then capturing and scanning the opposite state output of the fuse 12, some diagnostic capability is provided. The initial state at the D input of the flip-flop 18 is low prior to activation of the signal READ. Capturing and scanning the initial state allows for detection and diagnosis of defects in the scan chain that results in a stuck-at high condition. After activating the signal READ, the state will switch to high (prior to blowing the fuse 12) and defects in the scan chain that result in a stuck-at low condition can be detected. After the fuse 12 has been blown, it is not possible to detect stuck-at low defects in the scan chain with such a conventional approach.

Such a conventional approach will not work if one or more of the fuses in any of the fuse circuits have blown. The alternative technique described is also only useful for identifying defects that exist in the fuse scan chain. Additionally, the alternative technique does not assist in detecting defects that affect the latch circuit 16 and/or the flip-flop 18.

It would be desirable to provide a method and/or apparatus to (i) allow diagnostic capability of a fuse circuit when a fuse has blown and/or (ii) assist in detecting defects that affect the latch circuit and/or the flip-flop.

SUMMARY OF THE INVENTION

The present invention concerns an apparatus comprising a first control circuit, a second control circuit, a latch circuit and a flip-flop. The first control circuit may be configured to generate a first control signal in response to (i) an input signal from a fuse and (ii) one or more read signals. The latch circuit may be configured to change status in response to the first control signal. The second control circuit may be configured to change the state of the latch circuit in response to (i) one or more read signals and (ii) one or more set signals. The flip-flop may be configured to capture the state of the fuse in response to changing the state of the latch circuit with the first control circuit or the second control circuit.

The objects, features and advantages of the present invention include providing a fuse scan structure and/or method that may (i) provide the ability to set the state of all fuse read circuits in a device to diagnose defects, (ii) assist with the diagnosing of defects affecting chain logic, (iii) isolate defects on a particular latch or fuse, (iv) provide a circuit with a write capability to allow for writing a value to a particular latch through the scan chain and/or (v) assist in diagnosing defects affecting the latch with identifying transition sensitive defects.

BRIEF DESCRIPTION OF THE DRAWINGS

These and other objects, features and advantages of the present invention will be apparent from the following detailed description and the appended claims and drawings in which:

FIG. 1 is a circuit diagram of a conventional fuse circuit;

DETAILED DESCRIPTION OF THE PREFERRED EMBODIMENTS

Figure 2:
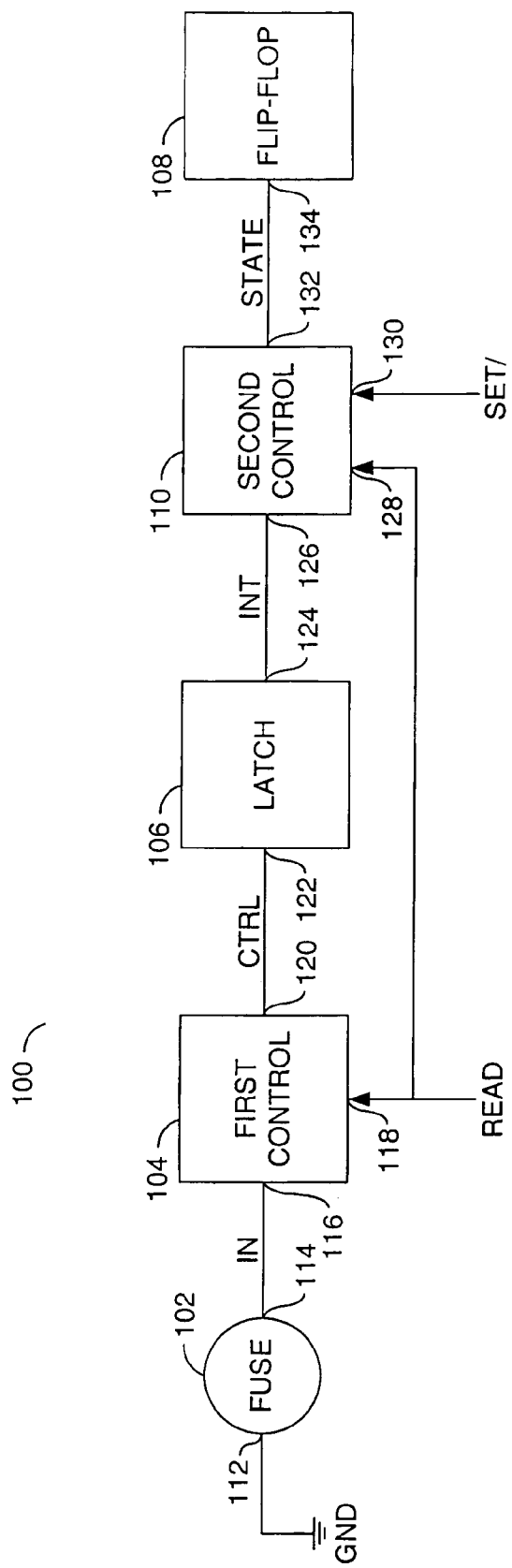
FIG. 2 is a block diagram illustrating a preferred embodiment of the present invention.

Referring to FIG. 2, a block diagram of a circuit 100 is shown in accordance with the preferred embodiment of the present invention. The circuit generally comprises a fuse 102, a control circuit 104, a circuit 106, a flip-flop 108 and a control circuit 110. The circuit 104 may be implemented as a first control circuit. The circuit 106 may be implemented as a latch circuit. The circuit 110 may be implemented as a second control circuit. The fuse 102 may have an input/output 112 that may be connected to a ground (e.g., GND). The fuse 102 may have an output 114 that may present an input signal (e.g., IN).

The first control circuit 104 may have an input 116 that may receive the signal IN. The first control circuit 104 may have an input 118 that may receive a signal (e.g., READ). The first control circuit 104 may have an output 120 that may present a control signal (e.g., CTRL).

The latch circuit 106 may have an input 122 that may receive the signal CTRL. The latch circuit 106 may have an output 124 that may present a signal (e.g., INT). The signal INT may be an intermediate signal. The second control circuit 110 may have an input 126 that may receive the signal INT. The second control circuit 110 may have an input 128 that may receive the signal READ and an input 130 that may receive a signal (e.g., SET). The second control circuit 110 may have an output 132 that may present a signal (e.g., STATE). The signal STATE may indicate the state of the fuse 102. The signal STATE may be high or low state. The flip-flop 108 may have an input 134 that may receive the signal STATE.

Figure 3:
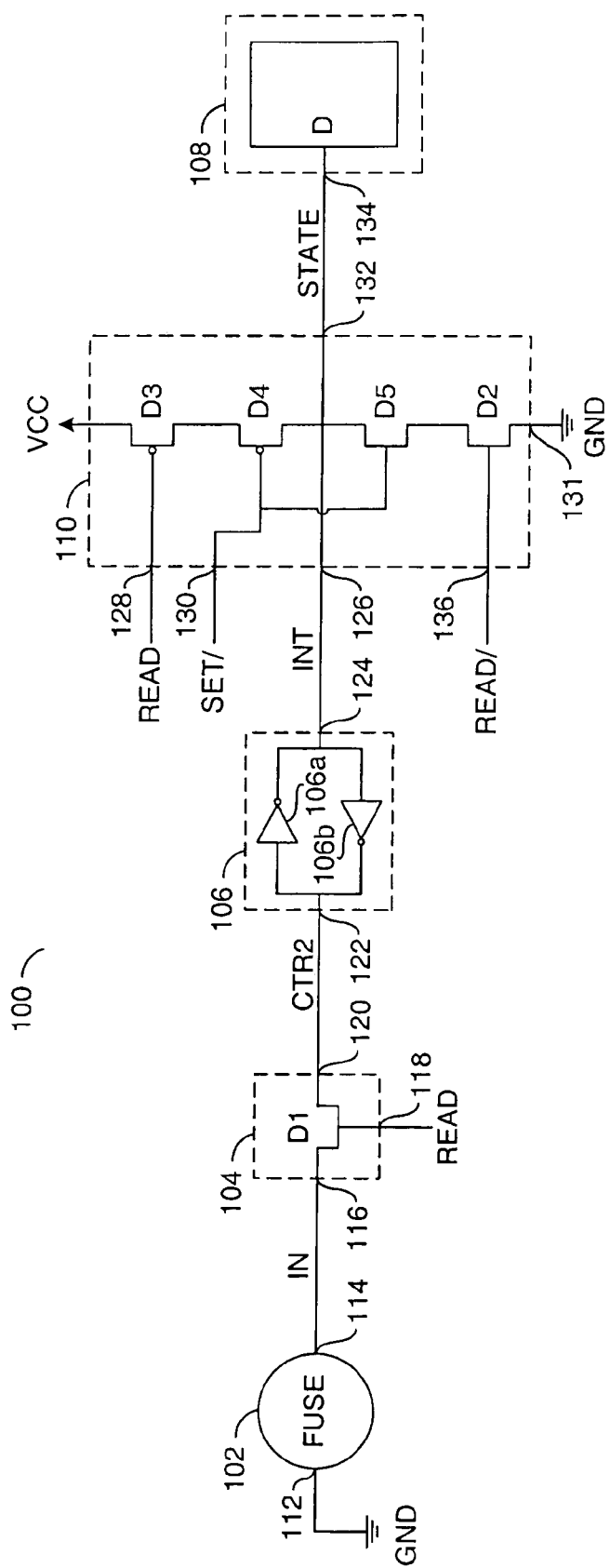
FIG. 3 is a more detailed block diagram illustrating a preferred embodiment of the present invention.

Referring to FIG. 3, a more detailed diagram of the circuit 100 is shown in accordance with a preferred embodiment of the present invention. The first control circuit 104 generally comprises a transistor D1. The signal READ may present a high or low voltage to a gate of the transistor D1. In general, the transistor D1 will turn on in response to the signal READ being enabled. The signal IN may be presented to the source of the transistor D1. A source of the transistor D1 may present the signal CTRL. The latch circuit 106 generally comprises an inverter 106a and an inverter 106b. The number of inverters used may be varied to meet the design criteria of a particular implementation.

The second control circuit 110 generally comprises a transistor D2, a transistor D3, a transistor D4 and a transistor D5. The signal READ is presented to the gate of the transistor D3. A supply voltage (e.g., VCC) may also be presented to the drain of the transistor D3. The drain of the transistor D4 may be connected to the source of the transistor D3. The signal SET/ may be presented to the base of the transistors D4 and D5. A signal (e.g., READ/) may be presented to the base of the transistor D2. The signal READ/ may be the digital complement of the signal READ. The source of the transistor D2 may be coupled to the GND at the input/output 131.

In one example, the flip-flop 108 may be implemented as a D-flip-flop. However, the type of flip-flop may be varied to meet the design criteria of a particular implementation. The flip-flop 108 may capture the state of the fuse 102 with the signal STATE.

If the signal READ is enabled, the state of the fuse 102 may be determined if the fuse 102 is not blown. In general, the transistors D1 and D3 will turn on in response to the signal READ being enabled. The latch circuit 106 may change states in response to the transistor D1 turning on. The second control circuit 110 may present the state of the fuse 102 on the signal STATE. The second control circuit 110 may allow the latch circuit 106 to be conditioned to either a normal low state or a normal high state. The second control circuit 110 may also allow data from the fuse 102 to set the latch circuit 106 when in the condition where the fuse 102 has not blown prior to performing a test.

In the condition where the fuse 102 has blown, a first set operation occurs. If the signal READ and the signal SET/ are enabled (e.g., in a state capable of enabling a transistor), the transistor D3 will turn on and pass a voltage below the input voltage VCC to the transistor D4. The transistor D4 generally turns on and changes the state of the latch circuit 106. The state of the latch circuit 106 may toggle to a low state or a high state depending on the initial state of the latch circuit 106 prior to enabling the signals READ and SET/.

In a second set operation, if the fuse 102 remains in a blown state, the second control circuit 110 may change the state of the latch circuit 106 after performing the first set operation. By enabling the signals READ/ and SET/, the transistors D2 and D5 will turn on. The state of the latch circuit 106 may toggle to the opposite state of the state obtained when the signals READ and SET/ are enabled. The final state of the latch circuit 106 depends on the initial state of the latch circuit 106 prior to enabling the signal READ/ and the signal SET/. If the signal SET is low, the circuit 100 will operate as the circuit of FIG. 1. The transistor D5 will be enabled and the transistor D4 will be disabled. The transistors D1 and D2 will function in response to the signal READ. For example, if the signal SET is high, the transistor D4 will be enabled and the transistor D5 will be disabled. The output of the latch 106 will now be pulled to a high state by activating the signal READ, regardless of the condition of the fuse 102. Diagnostic operations normally involve capturing a low signal when the signal SET is disabled and scanning the low value from all fuse circuits 12 to an output through the scan chain (to be described in more detail in connection with FIG. 5). The signal SET will then be enabled and a high level will be captured and scanned through the scan chain to the output.

Figure 4:
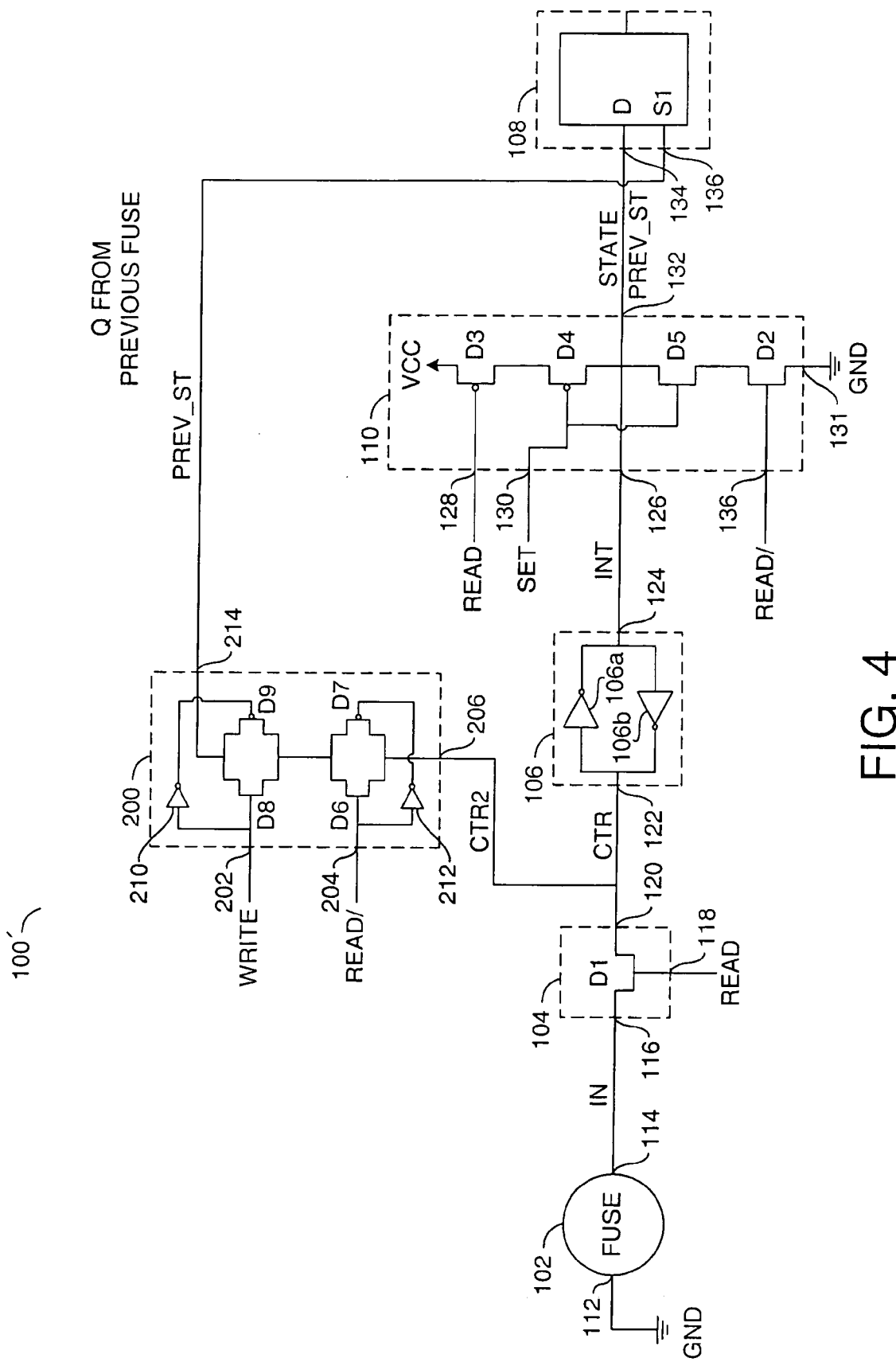
FIG. 4 is a more detailed block diagram illustrating another embodiment of the present invention.

Referring to FIG. 4, a circuit 100' is shown in accordance with another embodiment of the present invention. The circuit 100' generally comprises the fuse 102, the first control circuit 104, the latch circuit 106, the flip-flop 108, the second control circuit 110, and a circuit 200. The circuit 200 may be implemented as a third control circuit. The third control circuit 200 generally comprises a transistor D6, a transistor D7, a transistor D8, a transistor D9, an inverter 210, and an inverter 212.

The third control circuit 200 may have an input 202 that may receive a signal (e.g., WRITE). The third control circuit 200 may have an input 204 that may receive the signal READ/. The third control circuit 200 may have an output 206 that may present a control signal (e.g., CTR2). The third control circuit 200 may have an input 214 that may receive a signal (e.g. PREV_ST). The signal PREV_ST may be implemented as a previous scan on an output 136 of the flip-flop 106.

The signal WRITE may be presented to the gate of the transistor D8. The signal WRITE may be presented to the inverter 210. The inverter 210 may present the digital complement of the signal WRITE to a gate of the transistor D9. The signal PREV_ST may be presented to the drain of the transistors D8 and D9.

The signal READ/ may be presented to a gate of the transistor D6. The signal READ/ may be presented to an inverter 212. The inverter 212 may present the digital complement of the signal READ/ to a gate of the transistor D7. The source of the transistor D8 and D9 may be coupled to the drain of the transistors D6 and D7. The source of the transistors D6 and D7 may present the signal CTR2.

The third control circuit 200 generally provides the ability to write particular values to the fuse circuit 100'. In general, the third control circuit 200 may capture data from the previous scan of the flip-flop 108 on the signal PREV_ST to set the latch circuit 106 to a known state. During a first write operation, if the signal READ/, the signal WRITE and the signal PREV_ST are enabled, the transistors D6 and D8 will turn on. The transistors D8 and D9 and the transistors D6 and D7 may be configured as complementary gates to pass whatever signal is received on the source terminal. The transistors D8 and D9 will normally both either be enabled or disabled at the same time. If the signal WRITE is enabled, the transistors D8 and D9 will pass the signal PREV_ST to the source of the transistors D6 and D7. If the signal READ/ is enabled, the signal PREV_ST will continue to pass through the transistors D6 and D7 to generate the signal CTR2. Since the transistor D1 will be disabled if the signal READ is inactive, the state of the latch 106 will be determined by the signal PREV_ST when the signal WRITE and the signal READ/ are active. The signal PREV_ST may be captured as either a low or a high value. This signal PREV_ST is not enabled by a particular high or low state.

During a second write operation, if the signals READ/ and WRITE are disabled (e.g., set to a low state) and the signal PREV_ST is enabled, the transistors D7 and D9 will turn on. By turning on the transistor D7 and the transistor D9, the state of the latch circuit 106 will change to the opposite state produced when the signals READ/ and WRITE are enabled. The value on all of the flip-flops in a chain will be high or low in parallel. Certain faults in the scan chain may only be detected by shifting a low to high or high to low transition through the chain. The modified circuit shown in FIG. 4 allows loading of any sequence of values into the latch circuit 106 using the scan chain to shift in the values.

Figure 5:
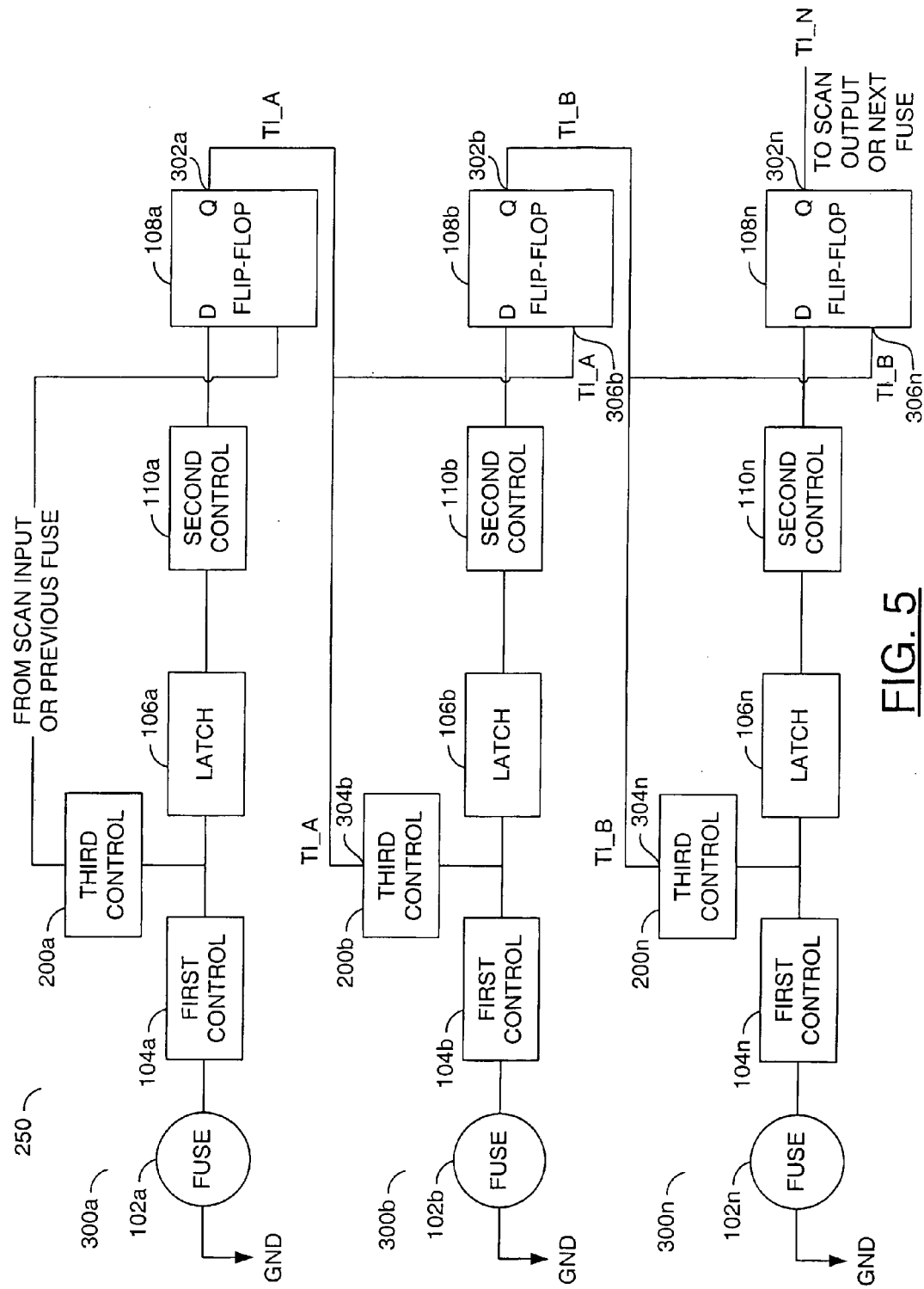
FIG. 5 is a block diagram illustrating a plurality of fuse circuits in a fuse scan chain.

Referring to FIG. 5, a block diagram illustrating a fuse scan chain 250 is shown. The fuse scan chain 250 generally comprises a plurality of fuse circuits 300a–300n. The fuse circuit 300a may be coupled to the fuse circuit 300b. The flip-flop 108a of the fuse circuit 300a may present a signal (e.g., TI_A) on an output 302a. The third control circuit 200b of the fuse circuit 300b may receive the signal TI_A on an input 304b. The flip-flop 108b of the fuse circuit 300b may receive the signal TI_A on an input 306b.

The fuse circuit 300b may be coupled to the fuse circuit 300n. The flip-flop 108b of the fuse circuit 300b may present a signal TI_B on an output 302b. The third control circuit 200n of the fuse circuit 300n may receive the signal TI_B on an input 304n. The flip-flop 108n of the fuse circuit 300n may receive the signal TI_B on an input 306n. The flip-flop 302n may present a signal (e.g., TI_N) on an output 302.

The signals TI_A, TI_B, and TI_N generally comprise data captured from the flip-flops 108a–108n. The data may be loaded into the scan chain by connecting the flip-flops 108a–108n via the Q to TI path using standard scan methods. The data may be captured by the latch circuits 106a–106n via the third control circuit 200a–200n. The data may be captured by the flip-flops 108a–108n and then scanned out. The flip-flops 108a–108n may also provide data on the signal TI_N to additional fuse circuits. The system 250 may be used to detect defects in any of the latch circuits 106a–106n and on the scan chains 300a–300n. Transitional faults may also be detected by varying the input data to the scan chains 300a–300n.

The present invention may (i) allow conditioning the state of all the latches in a fuse chain to either a low or high state, (ii) assist with the diagnosis of defects affecting chain logic, (iii) assist in isolating defects in a particular latch circuit or fuse, (iv) allow any value to be written to a particular latch circuit through the scan chain, (vi) assist in diagnosing defects affecting the latch circuit and/or (vii) identify transition sensitive defects.

The various signals of the present invention are generally "on" (e.g., a digital HIGH, or 1) or "off" (e.g., a digital LOW, or 0). However, the particular polarities of the on (e.g., asserted) and off (e.g., de-asserted) states of the signals may be adjusted (e.g., reversed) accordingly to meet the design criteria of a particular implementation. Additionally, inverters may be added to change a particular polarity of the signals.

As used herein, the term "simultaneously" is meant to describe events that share some common time period but the term is not meant to be limited to events that begin at the same point in time, end at the same point in time, or have the same duration.

While the invention has been particularly shown and described with reference to the preferred embodiments thereof, it will be understood by those skilled in the art that various changes in form and details may be made without departing from the spirit and scope of the invention.

The invention claimed is:

1. An apparatus comprising:
   a first control circuit configured to generate a first control signal in response to (i) an input signal from a fuse and (ii) one or more read signals;
   a latch circuit configured to change states in response to said first control signal;
   a second control circuit configured to change the state of said latch circuit in response to (i) said one or more read signals and (ii) one or more set signals;
   a flip-flop configured to capture the state of said fuse in response to changing the state of said latch circuit with said first control circuit or said second control circuit; and
   a third control circuit configured to (i) capture data from a previous scan of said flip-flop and (ii) set said latch circuit to one or more states in response to one or more write signals and said one or more read signals.

2. The apparatus according to claim 1, wherein the state of said latch circuit comprises a low state or a high state.

3. The apparatus according to claim 1, wherein said first control circuit comprises a transistor configured to change the state of said latch circuit in response to said one or more read signals.

4. The apparatus according to claim 1, wherein said second control circuit further comprises a plurality of transistors configured to change the state of said latch circuit in response to said one or more read signals or said one or more set signals.

5. The apparatus according to claim 1, wherein said third control circuit further comprises a plurality of transistors configured to change the state of said latch circuit in response to said one or more read signals and said one or more set signals.

6. The apparatus according to claim 1, wherein said flip-flop is connected to additional fuse circuits in a fuse scan chain.

7. The apparatus according to claim 6, wherein each of said additional fuse circuits comprises a separate latch circuit.

8. The apparatus according to claim 7, wherein each of said additional fuse circuits further comprises a separate set circuit configured to change the state of each of said separate latch circuits in response to said one or more set signals.

9. The apparatus according to claim 7, wherein each of said additional fuse circuits further comprises a separate third control signal configured to change the state of a particular separate latch circuit in any of said additional fuse circuits.

10. The apparatus according to claim 1, wherein said second control circuit further comprises a second plurality of transistors configured to change the state of said latch circuit in response to said one or more read signals and said one or more set signals.

11. The apparatus according to claim 1, wherein said third control circuit further comprises a third plurality of transistors and third comparator configured to change the state of said latch circuit in response to said one or more write signals.

12. A method comprising the steps of:
   (A) generating a first control signal in response to an input signal from a fuse and one or more read signals;
   (B) changing the state of a latch circuit with said first control signal and said one or more read signals;
   (C) changing the state of said latch circuit if said fuse has blown;
   (D) capturing the state of said fuse with a flip-flop in response to changing the state of said latch circuit;
   (E) capturing data from a previous scan of said flip-flop; and
   (F) chancing the state of said latch circuit in response to step (E).

13. The method according to claim 12, wherein step (E) further comprises:
   changing the state of said latch circuit in response to one or more write and said one or more read signals.

14. The method according to claim 12, wherein step (C) further comprises:

changing the state of said latch circuit in response to one or more read signals and one or more set signals.

15. The method according to claim 12, wherein step (D) further comprises the step of:

coupling said flip-flop to one or more additional fuse circuits in a fuse scan chain.

16. The method according to claim 15, further comprising:

detecting defects of said latch circuit and said fuse scan chain.

17. The method according to claim 16, further comprising:

varying input data to said fuse scan chain to detect transitional faults.

18. An apparatus comprising:

means for generating a first control signal in response to an input signal from a fuse and one or more read signals;

means for changing the state of a latch circuit with said first control signal;

means for changing the state of a latch circuit if said fuse has blown prior to testing said fuse;

means for capturing data from a previous scan of a flip-flop, and means for writing to said latch circuit in response to (i) capturing data from a previous scan of said flip-flop and (ii) one or more write signals.

* * * * *